United States Patent
Chen et al.

[11] Patent Number: 6,010,958
[45] Date of Patent: Jan. 4, 2000

[54] METHOD FOR IMPROVING THE PLANARIZATION OF DIELECTRIC LAYER IN THE FABRICATION OF METALLIC INTERCONNECTS

[75] Inventors: Tung-Po Chen, Taichung; Bing-Chang Wu, Taipei; Hong-Tsz Pan, Chutung Chen, all of Taiwan

[73] Assignee: United Microelectronics Corp., Hsinchu, Taiwan

[21] Appl. No.: 08/907,005

[22] Filed: Aug. 6, 1997

[30] Foreign Application Priority Data

May 20, 1997 [TW] Taiwan ................................ 86106698

[51] Int. Cl.$^7$ ................................ H01L 21/4763
[52] U.S. Cl. .................... 438/626; 438/631; 438/632; 438/634; 438/637; 438/645; 438/646; 438/937
[58] Field of Search ..................... 438/626, 631, 438/632, 634, 645, 646, 637, 937

[56] References Cited

U.S. PATENT DOCUMENTS

| | | |
|---|---|---|
| 4,229,232 | 10/1980 | Kirkpatrick ................ 148/1.5 |
| 4,284,659 | 8/1981 | Jaccodine et al. .............. 427/53.1 |
| 4,406,053 | 9/1983 | Takasaki et al. ................ 29/588 |
| 4,566,913 | 1/1986 | Brodsky et al. ................ 148/1.5 |
| 4,585,492 | 4/1986 | Weinberg et al. .............. 148/1.5 |
| 4,962,065 | 10/1990 | Brown et al. .................. 437/242 |
| 5,654,223 | 8/1997 | Jun et al. ..................... 438/254 |
| 5,656,556 | 8/1997 | Yang .......................... 438/646 |
| 5,760,474 | 6/1998 | Schuele ....................... 257/754 |
| 5,786,263 | 7/1998 | Perera ........................ 438/431 |
| 5,817,562 | 10/1998 | Chang et al. .................. 438/305 |

*Primary Examiner*—John F. Niebling
*Assistant Examiner*—David A. Zarneke
*Attorney, Agent, or Firm*—Finnegan, Henderson, Farabow, Garrett & Dunner, L.L.P.

[57] ABSTRACT

A method for improving the planarization of a dielectric layer in the fabrication of metallic interconnects wherein a rapid thermal processing operation is used in order to consolidate exposed surfaces of a dielectric layer after local planarization of the dielectric layer. This method avoids damage to the dielectric layer caused during a pre-metal etching operation, and consequently, prevents residual tungsten from becoming lodged in fissures during subsequent tungsten deposition to produce stringers which may cause short circuiting on coming in contact with metal wiring.

13 Claims, 6 Drawing Sheets

METHOD FOR IMPROVING THE PLANARIZATION OF DIELECTRIC LAYER IN THE FABRICATION OF METALLIC INTERCONNECTS

BACKGROUND OF THE INVENTION

1. Field of Invention

This invention relates to a method for improving the planarization of a dielectric layer in the fabrication of metallic interconnects, and more particularly to a dielectric planarization method employing rapid thermal processing (RTP) to achieve the high level of compaction desired for a dielectric layer.

2. Description of Related Art

In the production of metallic interconnects, the planarization of a dielectric layer is a very important part of the process. Owing to the good trench-filling capability of spin-on-glass (SOG) methods, it is generally accepted as the preferred method for local planarization.

FIGS. 1A through 1D are cross-sectional views showing the progression of manufacturing steps for the production of metallic interconnects using a conventional spin-on-glass method. First, referring to FIG. 1A, a substrate 10 with a MOS component already formed thereon is provided. The MOS component consists of source/drain regions 11 and gate region 12, with spacers 12a already formed on the sidewalls of the gate region 12 and with metal silicide layers 13, for example, titanium silicide ($TiSi_2$), already formed on the surfaces of the source/drain regions 11 and the gate region 12. Then, a dielectric layer 14 is formed on the substrate surface 10. The dielectric layer 14 may be, for example, a borophosphosilicate glass layer formed by a chemical vapor deposition method. Next, a spin-on-glass layer 15 is coated onto the surface of the dielectric layer 14 by a spin-on-glass method. Subsequently, the spin-on-glass layer 15 is removed by an etch-back operation.

Thereafter, referring to FIG. 1B, a pattern is defined on the dielectric layer 14 to form contact windows 16 exposing the metal silicide layers 13 above the source/drain regions 11. Afterwards, a pre-metal etching (PME) operation is performed to remove a native oxide layer (not shown) formed as a result of open air contact with the exposed portions 20 of metal silicide layer 13.

Referring next to FIG. 1C, a barrier layer 17, for example, a titanium/titanium nitride (Ti/TiN) layer, is formed over the dielectric layer 14 and the exposed portions of the metal silicide layer 13. Thereafter, a tungsten layer 18 is formed over the barrier layer 17 to fill completely the contact windows 16.

Finally, referring to FIG. 1D, the tungsten layer 18 is anisotropically etched back to form tungsten plugs using the barrier layer 17 as an etching stop layer. Lastly, a metallic layer 19, for example, an aluminum layer, is formed over the barrier layer 17 and the tungsten layer 18. Subsequently, a pattern is defined on the metallic layer 19 to complete the formation of the metallic interconnects.

In the aforementioned conventional method of fabricating metallic interconnects, owing to the presence of metal silicide layers on the surface of the source/drain regions for the lowering of contact resistance, a pre-metal etching (PME) operation is necessary after the formation of the contact windows. However, this pre-metal etching operation causes damage to the exposed surface 21 of the dielectric layer 14 in the form of voids and miniature fissures. FIG. 2 shows a picture taken by a scanning electron microscope (SEM) of the surface 21 of the dielectric layer 14 after a PME operation. Later in the process, when metallic tungsten is deposited, some of the metallic tungsten may seep into the fissures, and although there is a subsequent etching back operation, the in-filled tungsten in the fissures is rarely removed, and so metallic tungsten stringers may be left behind. FIG. 3 shows a picture taken by the scanning electron microscope (SEM) of the surface 21 of the dielectric layer 14 after the etching back of the metallic tungsten layer 18. As a result of the residual metallic tungsten still occupying the space within the fissures, short circuiting paths may be established with the subsequently deposited metallic wiring.

SUMMARY OF THE INVENTION

It is therefore an object of this invention to provide a method for improving the planarization of the dielectric layer in the fabrication of metallic interconnects. According to this method a rapid thermal processing is performed immediately after etching back of the dielectric layer so as to increase the level of compaction for the surfaces 21 of the dielectric layer 14 of a dielectric.

A second object of this invention is to provide a method for improving the planarization of the dielectric layer in the fabrication of metallic interconnects such that the formation of miniature fissures after the pre-metal etching operation can be avoided.

A third object of this invention is to provide a method for improving the planarization of the dielectric layer in the fabrication of metallic interconnects such that the formation of metallic tungsten stringers and resulting short circuiting can be avoided.

To attain the objects and advantages, and in accordance with the purpose of the invention, as embodied and broadly described herein, the invention comprises a method for improving the planarization of dielectric layer in the fabrication of metallic interconnects, the method comprising the steps of providing a substrate that has at least a MOS component already formed thereon, the MOS component including a gate region and source/drain regions, spacers on the sidewalls of the gate region, and a metal silicide layer on the gate region and the source/drain regions; forming a dielectric layer over the substrate surface; forming a spin-on-glass layer on the dielectric layer; etching the spin-on-glass layer; performing a rapid thermal processing for increasing the level of compaction of dielectric layer; defining a pattern on the dielectric layer, and forming a plurality of contact windows exposing portions of the metal silicide layer; performing a pre-metal etching operation on the exposed portions of the metal silicide layer; forming a barrier layer over the surface of the dielectric layer and the surfaces of the metal silicide layer; forming a metallic tungsten layer over the barrier layer to fill the contact windows; etching back the tungsten layer using the barrier layer as an etching stop to form a plurality of tungsten plugs; forming a metallic layer over the barrier layer and the tungsten plugs; and defining a pattern on the metallic layer to form metallic interconnects.

Preferably, the metal silicide layer is a titanium silicide ($TiSi_2$) layer. It is also preferred that the step of forming the dielectric layer include depositing a borophosphosilicate glass layer by chemical vapor deposition. The step of performing a rapid thermal processing preferably includes utilizing an operating temperature of about 600–900° C. The step of defining a pattern may be carried out before the step of performing a rapid thermal processing, and the step of forming the barrier layer may include providing a titanium/ titanium nitride (Ti/TiN) layer.

It is to be understood that both the foregoing general description and the following detailed description are exemplary and explanatory only and are not restrictive of the invention, as claimed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

Figure 1A:
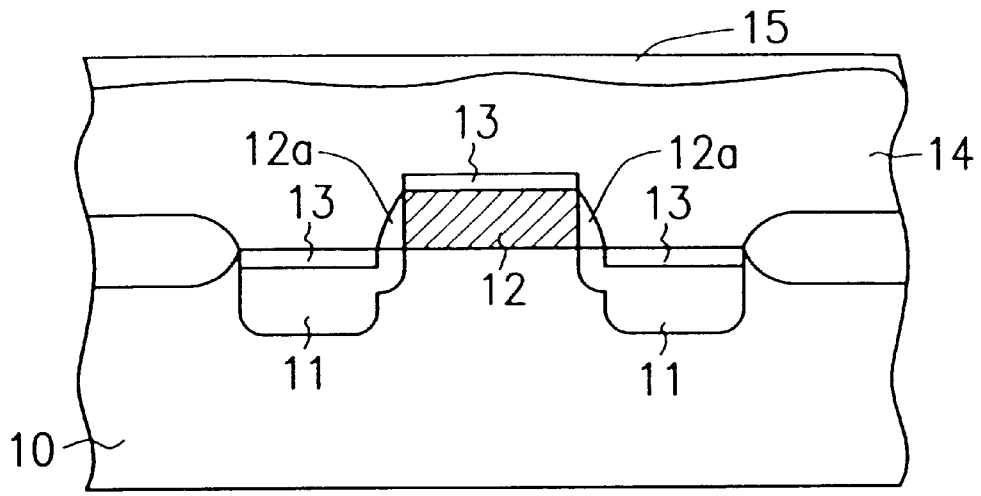
FIGS. 1A through 1D are cross-sectional views showing the progression of manufacturing steps for producing metallic interconnects by a conventional process.
Figure 1B:
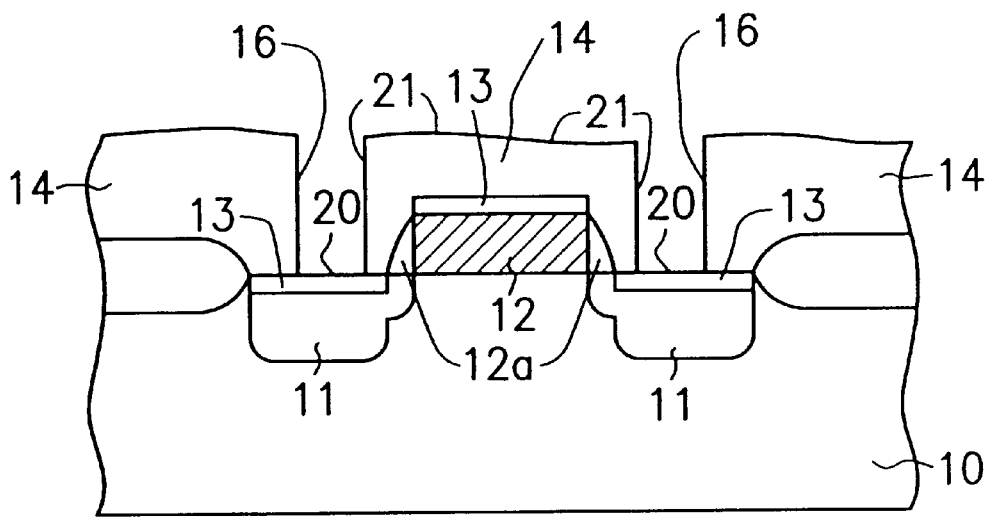
Figure 1C:
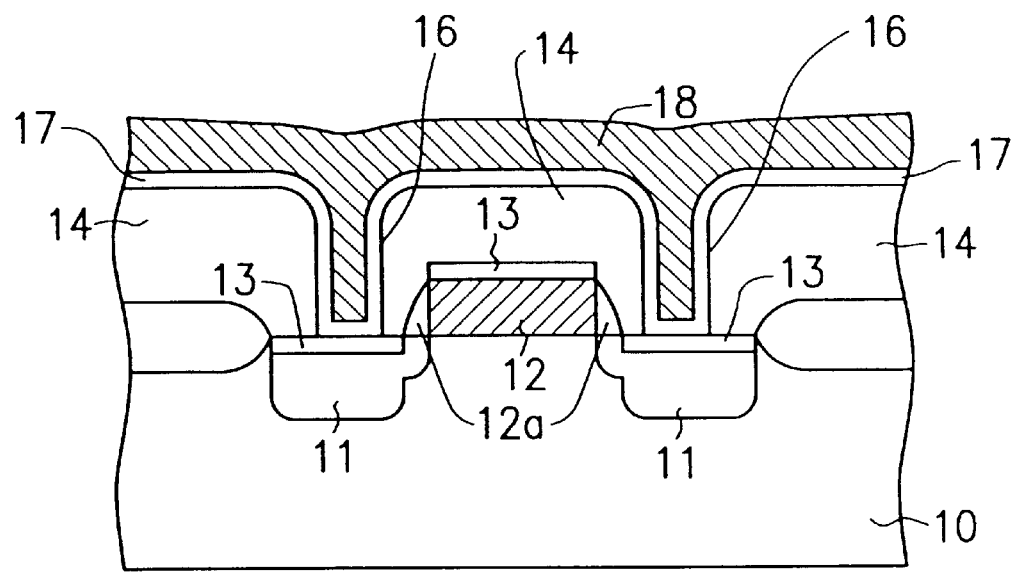
Figure 1D:
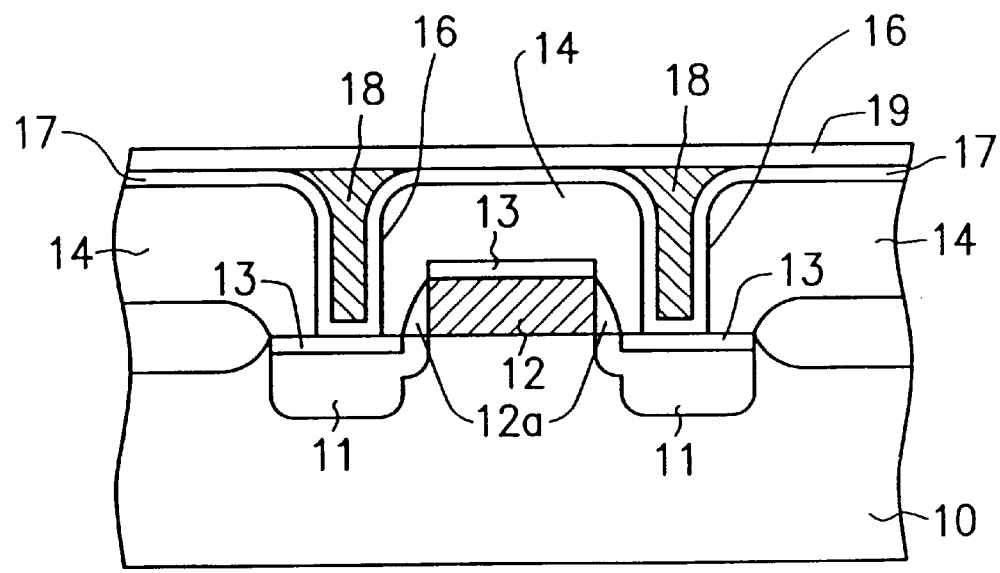
Figure 2:
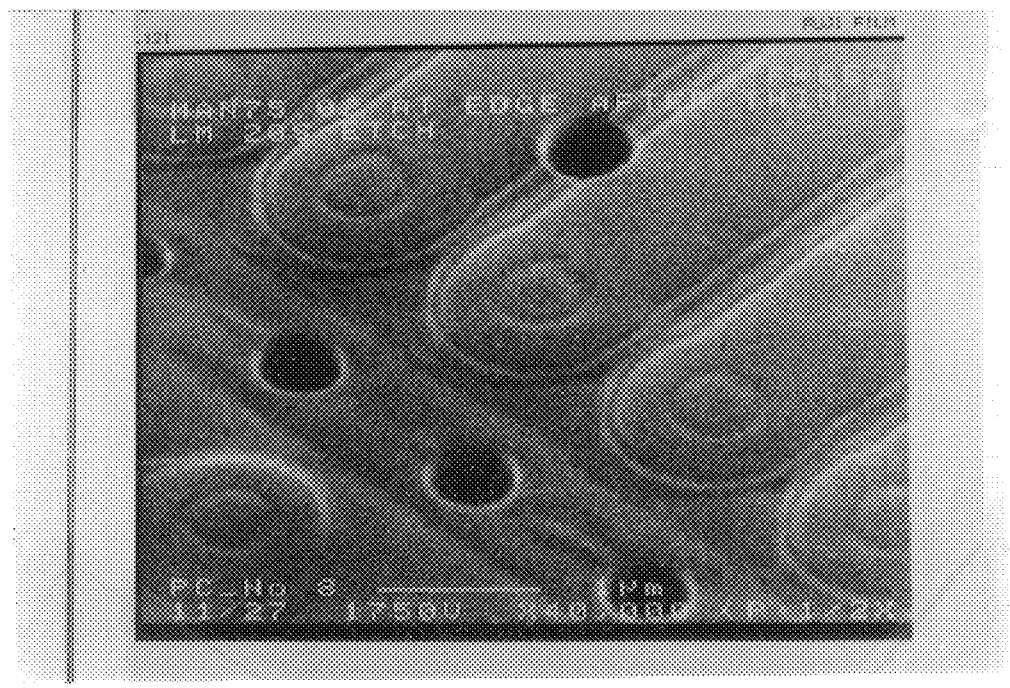
FIG. 2 is a photograph taken with a scanning electron microscope of the dielectric surface after a pre-metal etching process has been completed in the conventional method of fabricating metallic interconnects.
Figure 3:
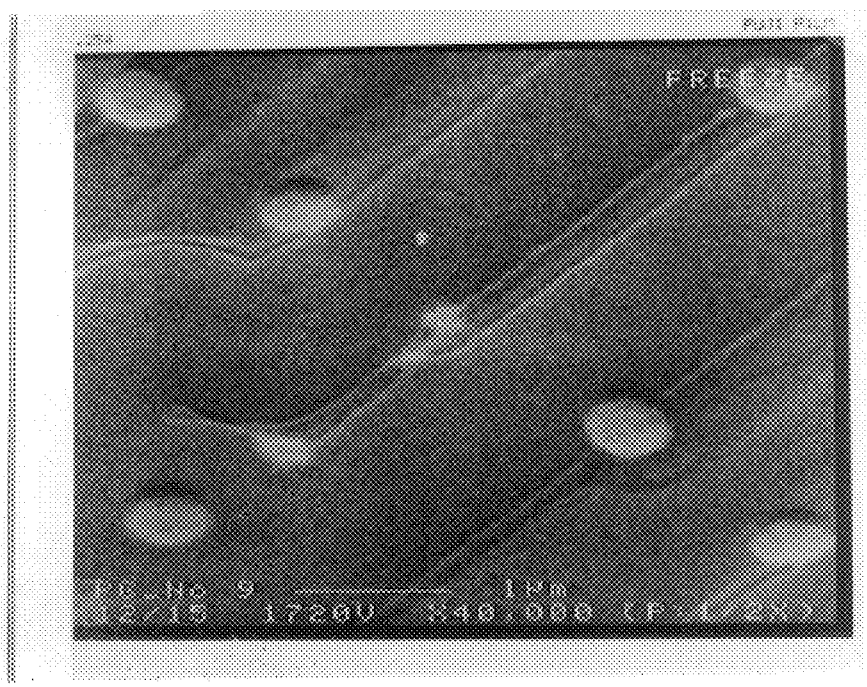
FIG. 3 is a photograph taken with a scanning electron microscope of the dielectric surface after the metallic tungsten layer has been back etched in the conventional method of fabricating metallic interconnects.

Reference will now be made in detail to the present preferred embodiment of the invention, an example of which is illustrated in the accompanying drawings. Wherever possible, the same reference numbers will be used throughout the drawings to refer to the same or like parts. FIGS. 4A through 4D are cross-sectional views showing the progression of manufacturing steps for producing metallic interconnects according to one preferred embodiment of this invention. First, referring to FIG. 4A, a substrate 40 with a MOS component already formed thereon is provided. The MOS component consists of source/drain regions 42 and gate region 41, with spacers 41a already formed on the sidewalls of the gate region 41 and with metal suicide layers 43, for example, titanium silicide ($TiSi_2$), already formed on the surfaces of the source/drain regions 42 and the gate region 41. Then, a dielectric layer 44 is formed on the substrate surface 40. For example, a borophosphosilicate glass layer may be formed by a chemical vapor deposition method. Following that, a spin-on-glass layer 45 is coated onto the surface of the dielectric layer 44 by a spin-on-glass method. Subsequently, the spin-on-glass layer 45 is removed by an etch-back operation.

Figure 4A:
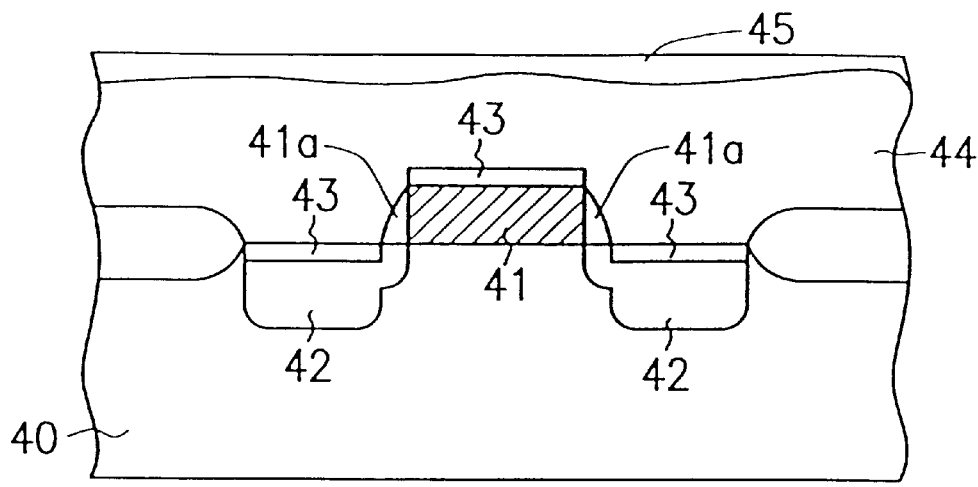
FIGS. 4A through 4D are cross-sectional views showing the progression of manufacturing steps for producing metallic interconnects according to one preferred embodiment of this invention.
Figure 4B:
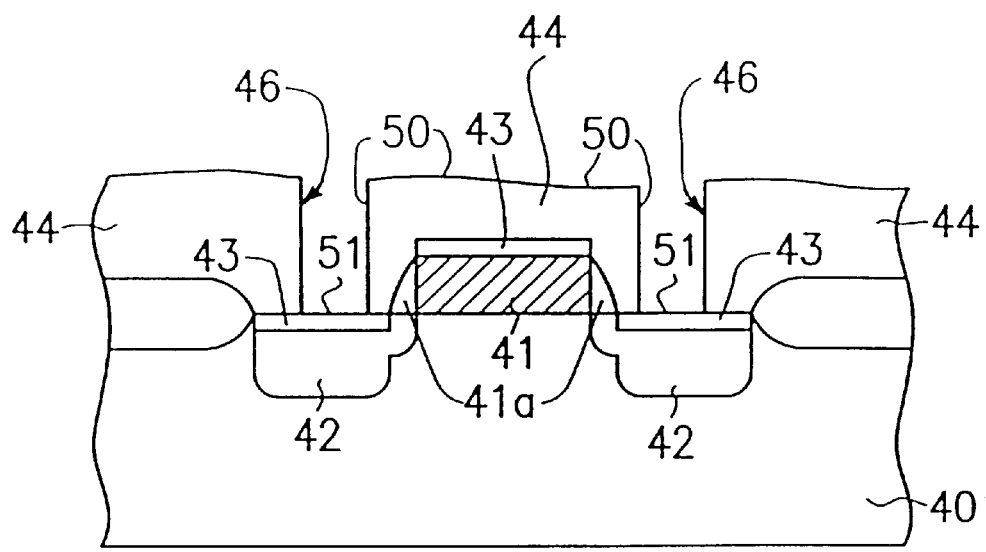

Thereafter, referring to FIG. 4B, the dielectric layer 44 undergoes a rapid thermal processing with an operating temperature of about 600–900° C. so that exposed surfaces 50 of the dielectric layer 44 become more compact. After that, a pattern is defined on the dielectric layer 44 to form contact windows 46 exposing the metallic silicide layer 43 above the source/drain regions 42 and the gate region 41. The rapid thermal processing can also be performed after the definition of the contact windows. In other words, a pattern may be defined on the dielectric layer 44 to form the contact windows 46 first, and then a rapid thermal annealing process may be carried out to consolidate the exposed surfaces 50 of the dielectric layer 44.

Figure 4C:
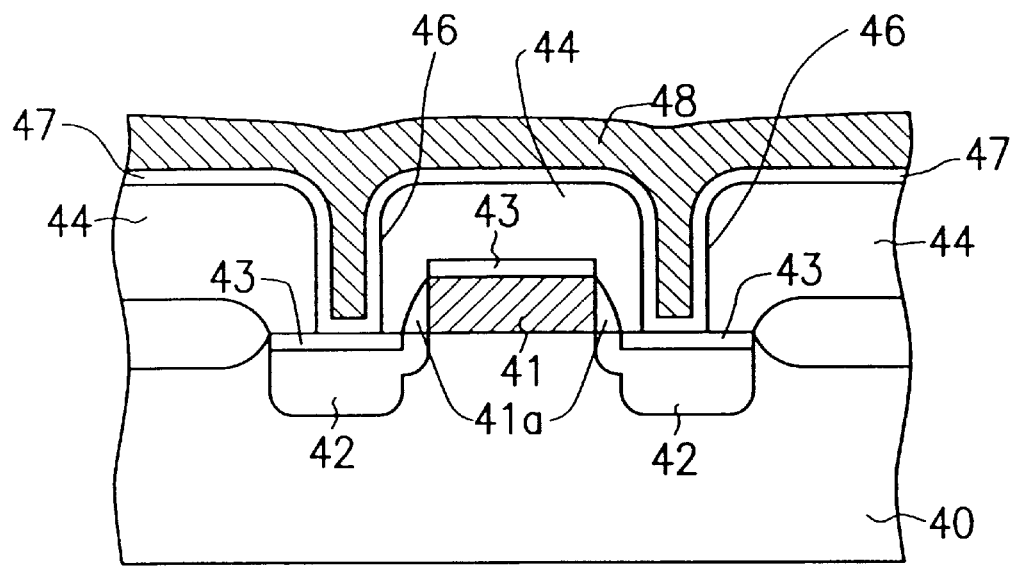

Referring next to FIG. 4C, a pre-metal etching (PME) operation is performed to remove a native oxide layer (not shown) formed as a result of open air contact with exposed portions 51 of the metal silicide layer 43. Thereafter, a barrier layer 47, for example, a titanium/titanium nitride (Ti/TiN) layer, is formed over the dielectric layer 44 and the exposed portions 51 of the metal silicide layer 43. Then, a tungsten layer 48 is formed over the barrier layer 47 to fill completely the via windows 46.

Figure 4D:
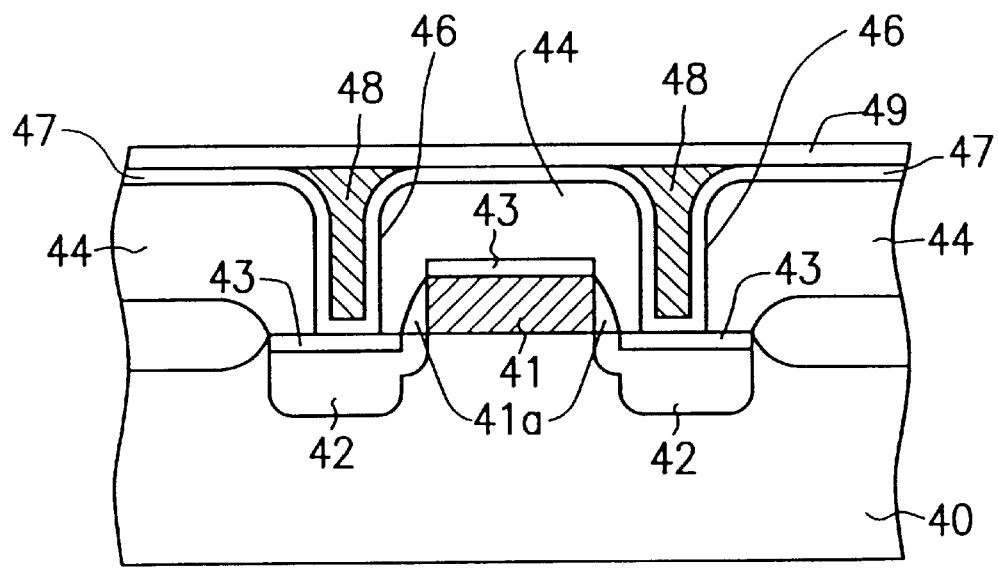

Finally, referring to FIG. 4D, the tungsten layer 48 is anisotropically etched back to form tungsten plugs 48 using the barrier layer 47 as an etching stop layer. Lastly, a metallic layer 49, for example, an aluminum layer, is formed over the barrier layer 47 and the tungsten layer 48. Subsequently, a pattern is defined on the metallic layer 49 to complete the formation of metallic interconnects.

Figure 5:
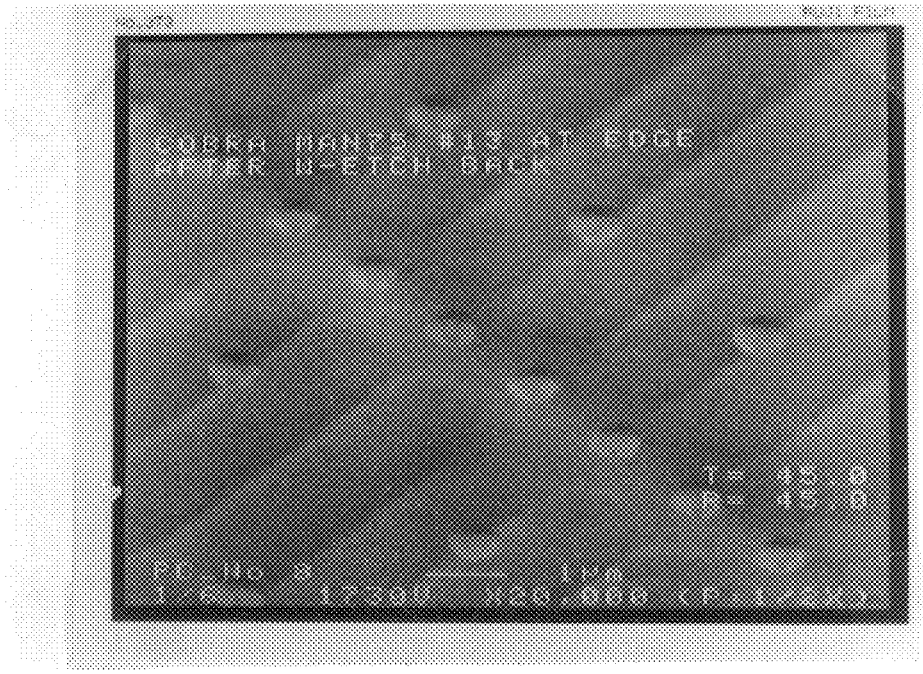
FIG. 5 is a photograph taken with a scanning electron microscope of the dielectric surface after the formation of the dielectric layer and subsequent rapid thermal processing in the production of metallic interconnects according to one preferred embodiment of this invention.
Figure 6:
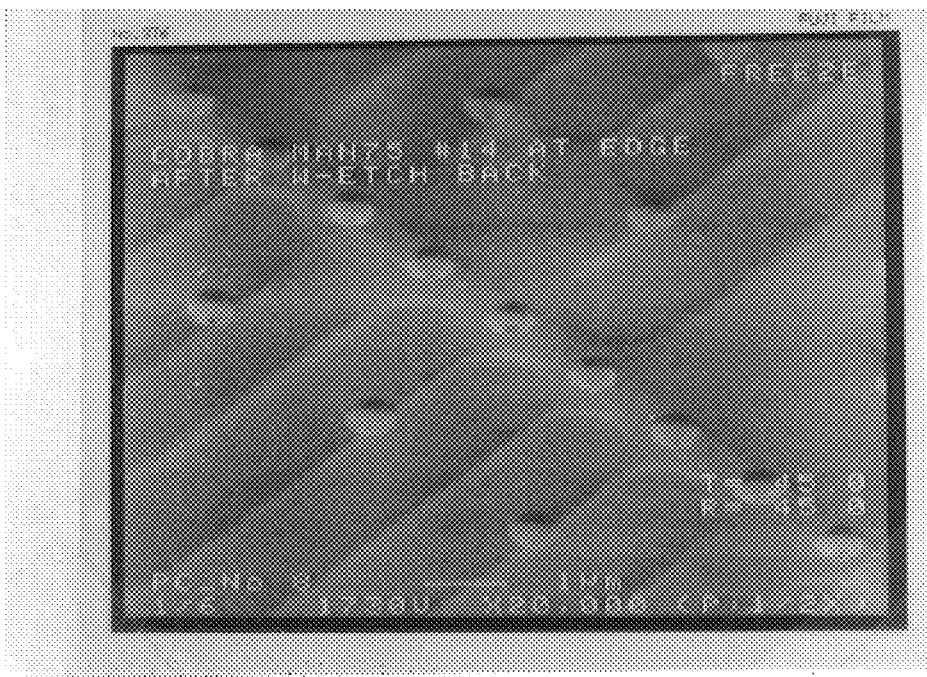
FIG. 6 is a photograph taken with a scanning electron microscope of the dielectric surface after the formation of the via windows and subsequent rapid thermal processing in the production of metallic interconnects according to one preferred embodiment of this invention.

It does not truly matter whether a rapid thermal processing is added after the formation of the dielectric layer or after the formation of the contact windows. In either case, the addition of a rapid thermal processing step is capable of consolidating the superficial layer (50 shown in FIG. 4B) of the dielectric. The preferred outcome is revealed by the photographs in FIGS. 5 and 6 taken with a scanning electron microscope. As is shown, there are no miniature fissures or voids in the surface of dielectric layer 44 and so an optimally planarized dielectric surface is obtained. Hence, when tungsten plugs are subsequently formed, the presence of residual metallic tungsten in fissures which can cause formation of stringers on the dielectric surface is avoided. Therefore, short circuiting from contact of such stringers with metal wiring is prevented.

While the invention has been described by way of example and in terms of the preferred embodiment, it is to be understood that the invention is not limited to the disclosed embodiments. To the contrary, the appended claims are intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for improving the planarization of a dielectric layer in the fabrication of metallic interconnects comprising the steps of:

providing a substrate having at least a MOS component formed thereon, the MOS component including a gate region having sidewalls, source/drain regions, spacers on the sidewalls of the gate region, and a metal silicide layer on the gate region and the source/drain regions;

forming a dielectric layer having a superficial layer over the substrate;

forming a spin-on-glass layer on the dielectric layer;

etching the spin-on-glass layer;

performing a rapid thermal processing for consolidating the superficial layer of the dielectric layer;

defining a pattern on the dielectric layer to form a plurality of contact windows and to expose portions of the metal silicide layer;

performing a pre-metal etching operation on the exposed portions of themetal silicide layer;

forming a barrier layer over the dielectric layer and the surfaces of the metal silicide layer;

forming a metallic tungsten layer over the barrier layer to fill the contact windows;

etching back the tungsten layer using the barrier layer as an etching stop to form a plurality of tungsten plugs;

forming a metallic layer over the barrier layer and the tungsten plugs; and defining a pattern on the metallic layer to form metallic interconnects.

2. A method according to claim 1, wherein the metal silicide layer is a titanium silicide ($TiSi_2$) layer.

3. A method according to claim 1, wherein the step of forming the dielectric layer includes depositing a borophosphosilicate glass layer by chemical vapor deposition.

4. A method according to claim 1, wherein the step of performing a rapid thermal processing includes utilizing an operating temperature of about 600–900° C.

5. A method according to claim 1, wherein the step of defining a pattern is carried out before the step of performing a rapid thermal processing.

6. A method according to claim 1, wherein the step of forming the barrier layer includes providing a titanium/titanium nitride (Ti/TiN) layer.

7. A method according to claim 1, wherein the step of forming th e metallic layer includes providing an aluminum layer.

8. A method for preventing formation of metal stringers that cause a short circuit by contacting with metallic interconnects over a superficial layer of a dielectric layer, the method comprising the steps of:

providing a substrate having at least a MOS component formed thereon, the MOS component including a gate region having sidewalls, source/drain regions, spacers on the sidewalls of the gate region, and a metal suicide layer on the gate region and the source/drain regions;

forming a dielectric layer having a superficial layer over the substrate;

forming a spin-on-glass layer on the dielectric layer;

etching the spin-on-glass layer;

performing a rapid thermal processing for consolidating the superficial layer of the dielectric layer;

defining a pattern on the dielectric layer to form a plurality of contact windows and to expose portions of the metal silicide layer;

performing a pre-metal etching operation on the exposed portions of the metal silicide layer;

forming a barrier layer over the dielectric layer and the surfaces of the metal silicide layer;

forming a metallic tungsten layer over the barrier layer to fill the contact windows;

etching back the tungsten layer using the barrier layer as an etching stop to form a plurality of tungsten plugs;

forming a metallic layer over the barrier layer and the tungsten plugs; and defining a pattern on the metallic layer to form metallic interconnects.

9. The method of claim 8, wherein the pattern on the dielectric layer is defined after the step of performing a rapid thermal processing.

10. The method of claim 8, wherein the pattern on the dielectric layer is defined before the step of performing a rapid thermal processing.

11. The method of claim 8, wherein the dielectric layer is made of borophosphosilicate glass.

12. The method of claim 8, wherein the step of performing a rapid thermal processing includes utilizing an operating temperature of about 600–900° C.

13. The method of claim 8, wherein the metallic layer is made of aluminum.

* * * * *